United States Patent [19]
Whittaker

[11] Patent Number: 5,701,431
[45] Date of Patent: Dec. 23, 1997

[54] METHOD AND SYSTEM FOR RANDOMLY SELECTING A CACHE SET FOR CACHE FILL OPERATIONS

[75] Inventor: Bruce Ernest Whittaker, Mission Viejo, Calif.

[73] Assignee: Unisys Corporation, Blue Bell, Pa.

[21] Appl. No.: 592,090

[22] Filed: Jan. 26, 1996

[51] Int. Cl.[6] .......................... G06F 12/08; G06F 11/16
[52] U.S. Cl. .......................... 395/455; 395/182.06; 395/460
[58] Field of Search .......................... 395/455, 182.06, 395/460

[56] References Cited

U.S. PATENT DOCUMENTS

| | | |
|---|---|---|
| 5,019,971 | 5/1991 | Lefsky et al. .................. 395/455 |
| 5,133,061 | 7/1992 | Melton et al. .................. 395/455 |
| 5,553,263 | 9/1996 | Kalish et al. .................. 395/454 |
| 5,568,632 | 10/1996 | Nelson .................. 395/460 |

*Primary Examiner*—Eddie P. Chan
*Assistant Examiner*—Reginald G. Bragdon
*Attorney, Agent, or Firm*—Alfred W. Kozak; Mark T. Starr; Steven R. Petersen

[57] ABSTRACT

A central processor is serviced by a multi-way cache module having N cache sets some of which can be taken off-line by a maintenance subsystem. Masking logic is provided to control the fill-operation cycles to cache so that equitable distribution of fill-data is allocated among only those cache sets remaining on-line.

4 Claims, 5 Drawing Sheets

(Mask Logic Unit)

5,701,431

METHOD AND SYSTEM FOR RANDOMLY SELECTING A CACHE SET FOR CACHE FILL OPERATIONS

FIELD OF THE INVENTION

This disclosure relates to cache systems organized into multi-set portions and algorithms providing for the most efficient utilization of those cache sets which are enabled for operation.

BACKGROUND OF THE INVENTION

FIG. 4 shows a simplified picture of a network involving a processor 14 with cache 19 connected via a data path array 20 to main memory 40. This network includes a cache memory module 19 to enhance system performance. As seen in FIG. 4, whenever the processor 14 needs data from main memory 40, the cache module 19 is the first line of resource for acquiring this data. An efficient cache design will on average, contain desired information within the cache memory about 90% of the time. If the cache 19 does not have the required information available in its latest most valid state, then the processor 14 must access the system main memory 40 over DataPath Array Interface 20 via a system bus 22 in order to acquire the needed data. This latter situation, of course, is much slower in time than the "cache hit" situation where the cache memory 19 can immediately supply the required data to the processor 14.

FIG. 5 illustrates the typical elements of a cache memory design showing the various elements of the cache memory module 19. As seen in FIG. 5, the processor bus interface to the processor 14 includes two busses shown as the address bus (14ba) and the data bus (14bd). The cache module 19 is seen to have three basic major units. These are a Tag RAM unit $19_t$, a Data RAM $19_d$ and a Cache Control unit 16. The Tag RAM unit $19_t$ in all cache designs will hold the addresses of the data which is contained in the Data RAMs $19_d$ at any particular moment. The Tag RAM $19_t$ provides the means by which comparisons are made of processor address requests for comparison with the address values held in the Tag RAM $19_t$. A successful compare situation occurs which is called a "cache hit" because it indicates that the cache module 19 does indeed contain valid data for the specified address which is immediately available to the processor 14.

The Data RAM $19_d$ of FIG. 5 is the storage area for all the data held within the cache module 19 at any given moment. The Data RAMs are generally very expensive and very fast RAM devices that can return data to the processor very rapidly during a "cache hit" condition.

The cache control unit 16 of FIG. 5 monitors the Tag RAMs "hit condition" and controls the reading out of the Data RAMs $19_d$. For a Tag "miss" condition, (that is to say not a "hit") the Cache Control unit 16 controls the writing into the Data RAMs of data which is subsequently accessed from main memory 40. This later activity, after a "miss" cycle has occurred, is called "filling" the cache.

In order to gain higher cache "hit" rates, that is to say, 90% and above, it has been found that a special structuring of the cache data into several groups or sets of banks of data is a very effective organization. These groups or "banks" of data are often referred to as "sets" or "ways". FIG. 1 is a drawing illustrating the expansion of the Data units and Tag units in separate modules to illustrate them as a four-set type of cache organizational structure. Here, the Data RAM $19_d$ is broken into four separate data groups or data sets designated as $19_{d0}$, $19_{d1}$, $19_{d2}$, and $19_{d3}$. Thus, for a 64,000 word cache (64K) the data will be grouped into four groups of 16K word cache sets. It may be noted that only one of the four sets will contain data for any given address at any given time. Thus, for a cache "hit", only one of the four sets of the Data RAMs $19_d$ will be enabled to drive data back on to the processor bus and thence to the processor 14.

As seen in FIG. 1, each of the cache sets has its own Tag RAM facility. Thus, there is seen four Tag RAMs. Each Tag RAM $19_t$ is a 4K RAM, since each of the 4,000 addresses it contains actually points at a "four-word" block in the Data RAMs $19_d$. It will be seen that the multiple sets of Tag RAMs are designated $19_{t0}$, $19_{t1}$, $19_{t2}$, $19_{t3}$.

With the multiple sets (4 here shown as an example), only 1 set is allowed to contain a given address value and to thus produce a "hit" condition at any one given time. The Tag set $19_t$ that produces the "hit" will select its Data RAM $19_d$ to drive data back to the processor 14.

In a discussion above, the primary concerns have involved the concept of cache "hits". However, in order to have "hits", the cache module 19 (FIG. 5, and FIG. 1) must have previously been written to and loaded with valid data from the main memory 40 (FIG. 4). Thus, the cache must have previously been "filled". When the cache 19 does not get a "hit" condition for a processor data Read operation, it is then said that the cache has had a "miss" condition. On cache "misses", the requested data must then be obtained from the main memory 40 and then returned to the processor 14. And at the same time, the retrieved data that had been missed will now be written into the cache Data RAMs $19_d$. Thus, this writing into the Data RAMs is designated as the "filling" process.

Not only is data written into the Data RAMs $19_d$, but the corresponding Tag RAM $19_t$ for that Data RAM set must also be written with the appropriate address of the data word involved. The "address" value for the data in question is written into the Tag RAM $19_t$ and is marked as "valid" (v=1) therein. Subsequently, the next time that the processor 14 requests a reading on that specific address, the Tag RAM $19_t$ will give a "hit" and that data will be transferred immediately to the processor 14 from the Data RAM $19_d$.

In a multiple way or a multiple set cache organization such as seen in FIG. 1, there are often conditions which require that certain of the sets be disabled. In this situation, the cache memory 19 will be operating in a degraded condition. Under normal operations, a multiple set structured cache is operative with all of its sets enabled and in operating condition. However, in either case, the multiple set structured cache must be filled with new data and address values under the direction of the control logic 16(FIG. 2), which logic must operate to resolve the question as to what particular set shall the new data be written into. Unless some algorithmic control is applied to this situation, it is possible that only one cache set will be favored with data and others will be neglected, thus leading to inefficiencies in the operation of the system. Thus, the present disclosure seeks to solve the problem of using or utilizing a "filling" process in a multiple set cache to insure that the maximum usage of the various cache sets are utilized in the most efficient fashion and that no one set is favored or neglected over the other.

SUMMARY OF THE INVENTION

A central processor utilizes a multi-way cache module having N cache sets. Under certain conditions, as determined by a maintenance subsystem, not all cache sets may be operable but the remaining on-line cache sets can still

3 permit operations on a degraded basis. However, it is still necessary that the remaining on-line cache sets be given equal opportunity to participate in taking the fill operation to store data words without overworking or overfilling just one cache set.

A mask logic unit is implemented to sense which cache sets are placed off-line so as to then utilize the on-line cache sets in an equitable fashion by using a random number counter for selecting a particular cache set to fill.

DESCRIPTION OF PREFERRED EMBODIMENT

Figure 1:
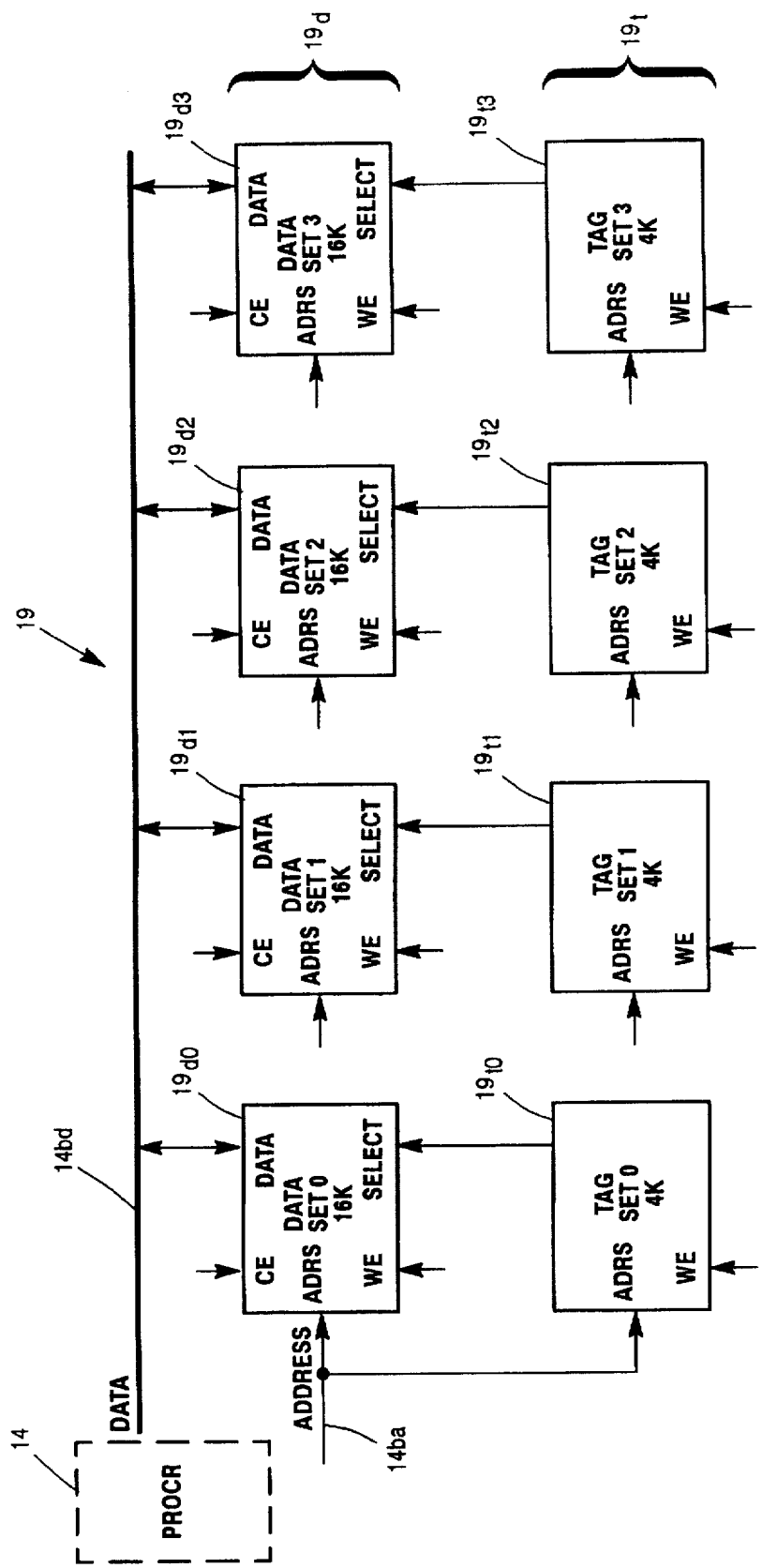
FIG. 1 is a drawing of a multiple set type of cache memory structure of the prior art.
Figure 2:
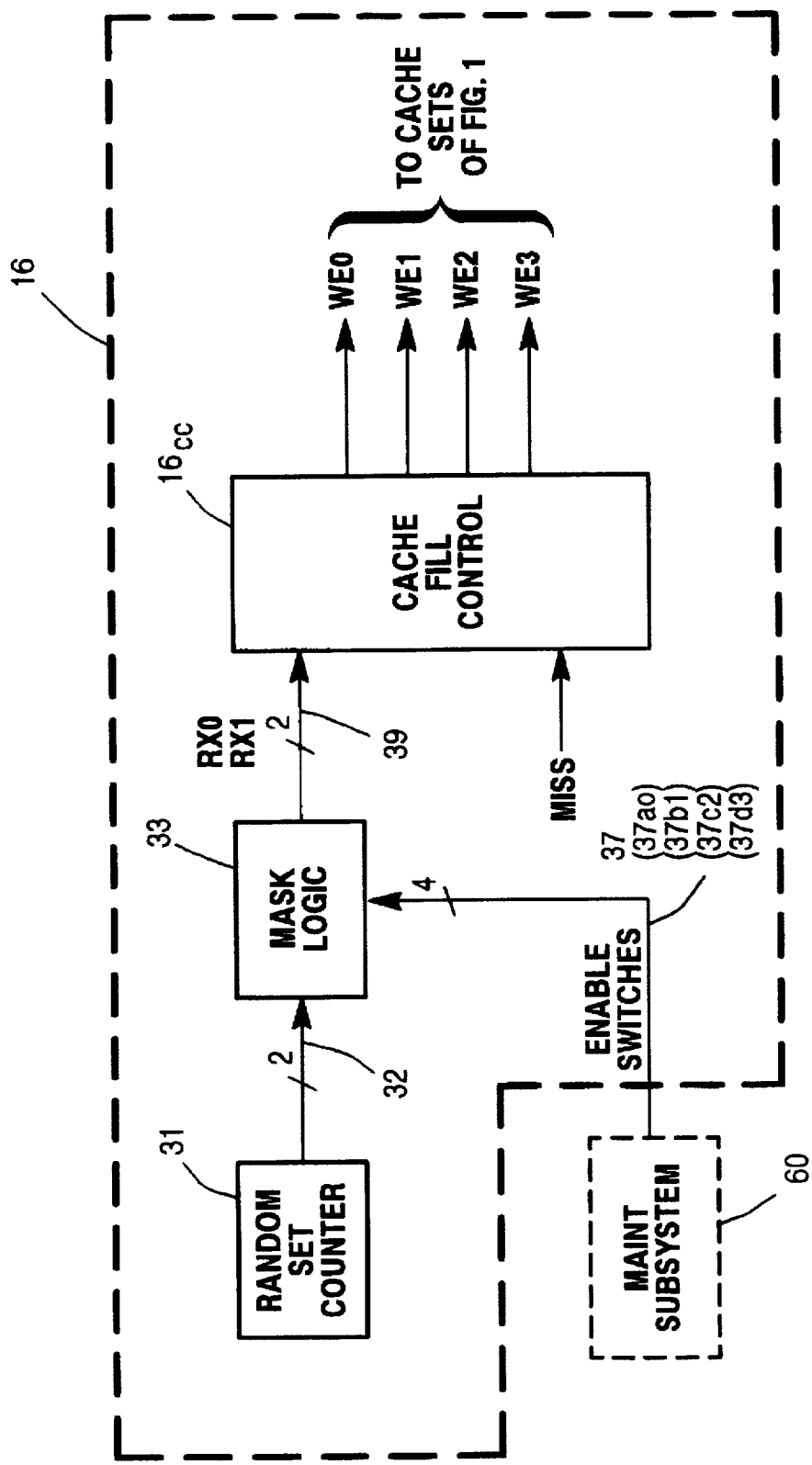
FIG. 2 is a drawing of the cache control logic used for writing into multiple sets of cache memory.
Figure 5:
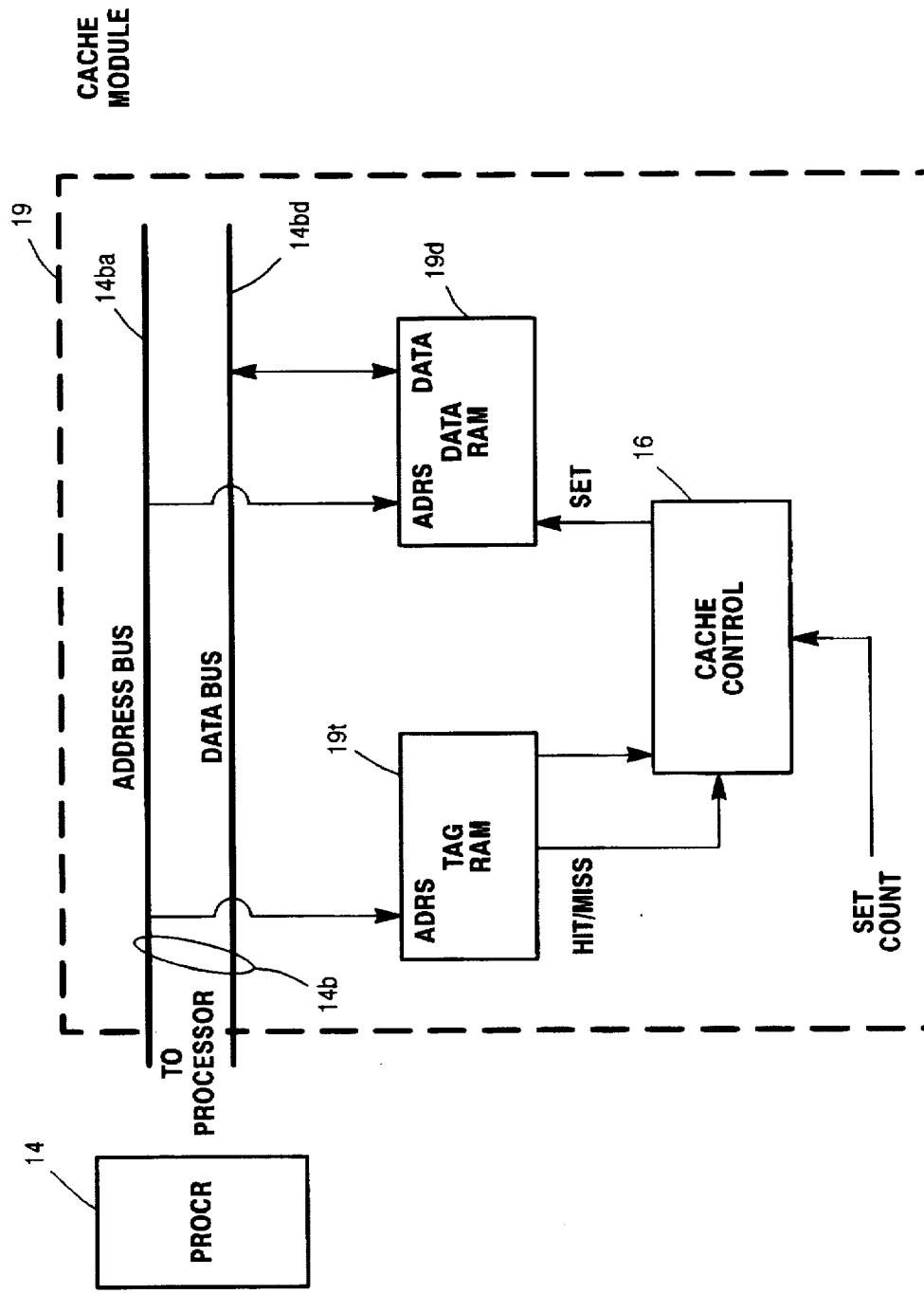
FIG. 5 is a drawing showing the basic elements which comprise a cache memory module of the prior art.

When a multiple set structured cache must be filled with new data and address values on a "filling cycle", the cache control logic 16 of FIG. 5 must make a proper allocation of how it will choose where to place data and addresses among the multiple sets of cache memory units of FIG. 1. Thus, the question arises as to what particular set shall the new incoming data be written to? The present system describes and provides a method for the utilization of a "random" fill algorithm. This method chooses which one of the four sets of cache units into which to write new data on a random count basis. FIG. 2 shows the cache control logic 16 which is used to write into the four sets of cache sub-units. As seen in FIG. 2, there is a "random set counter" unit 31. This random set counter 31, is a counter that provides a count specifying each one of the four sets of cache sub-units by using the counts of 00, 01, 10, and 11, and performs a choice of a particular set "randomly" in cache operations.

A random count could be approximated in several different ways. In the present instance, a free-running counter operating at a clock frequency which is "asynchronous" to the cache logic 16 is used herein. This simplified method creates a pseudo-random number of 00, 01, 10, or 11 which then points to the particular cache set to be filled.

FIG. 2 shows a mask logic block unit 33, which provides the main focus for the operative system. The mask logic block unit 33 "modifies" the "random count" on line 32 from counter 31 and converts it into a "masked" count on line 39 for transmission to the cache fill control unit 16cc. The operation of the mask logic block unit 33 is subsequently described in more detail hereinafter.

Also indicated in FIG. 2 is the Cache-Fill control block unit 16cc. This provides logic which takes the "masked count" and, on cache-miss conditions, generates the Write enable signals (WE0, WE1, WE2, WE4), to the specified cache set in the cache module 19 of FIG. 1.

Further, FIG. 2 shows four enable switch lines $37_{a0}$, $37_{b1}$, $37_{c2}$ and $37_{d3}$ which are controlled by the maintenance sub-system 60. The switches which enable these lines allow the operating personnel and the maintenance software to control which one of the cache sets are to be operating at any given time. This selection may be made for maximum performance, wherein all sets are chosen or may be enabled on some degraded operational level such as putting some of the cache sets "off-line". The degraded modes may be used for maintenance reasons when cache errors are detected or for some other operational reason. The enable switch lines 37 are provided as inputs to the mask logic block unit 33.

MULTIPLE-SET MASKING LOGIC 33

In reference to FIG. 2, the masking logic block unit 33 receives two input sources on lines 32 and 37 and provides one output on line 39.

Figure 3:
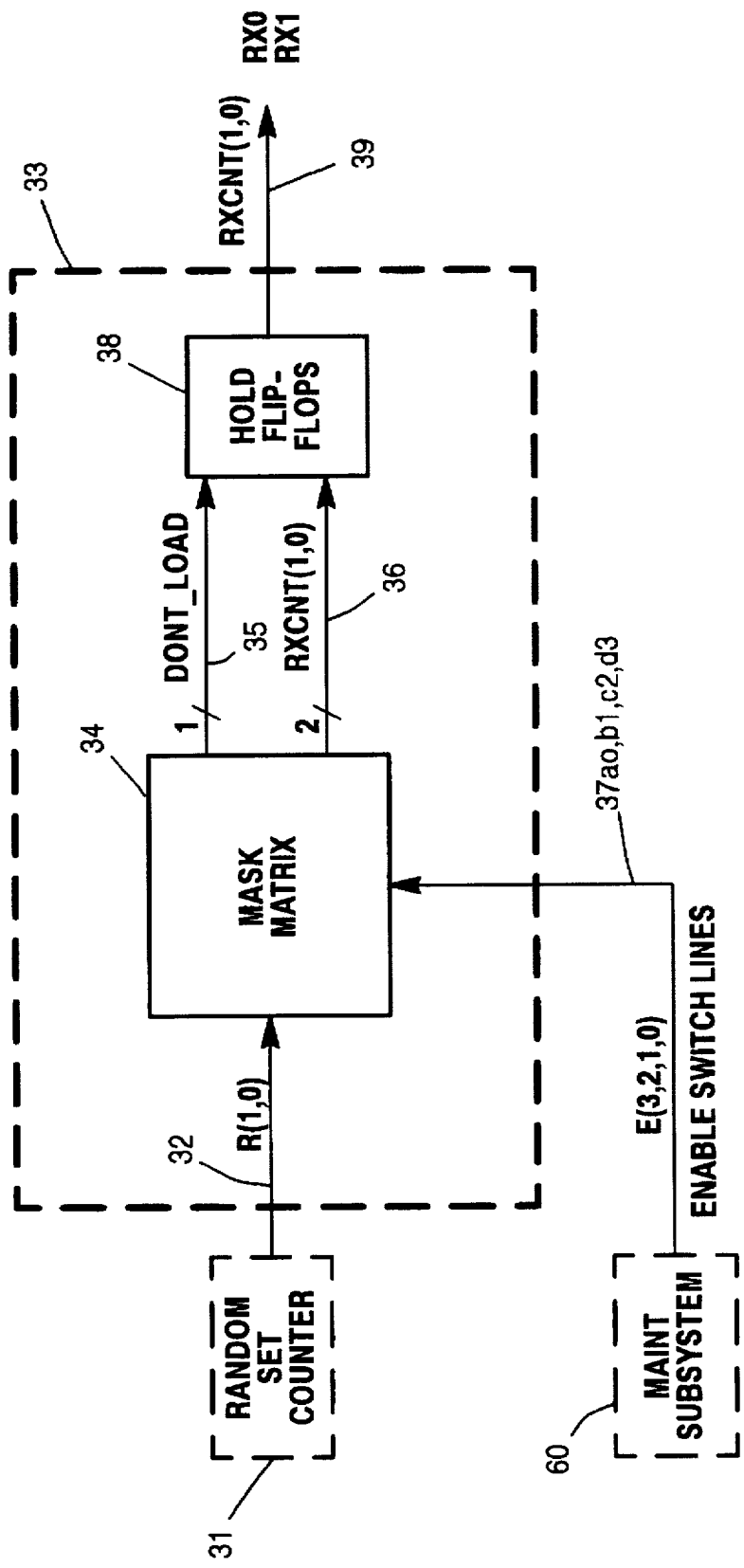
FIG. 3 is a drawing of a mask logic unit for enabling the efficient filling and utilization of a multiple set cache memory.
Figure 4:
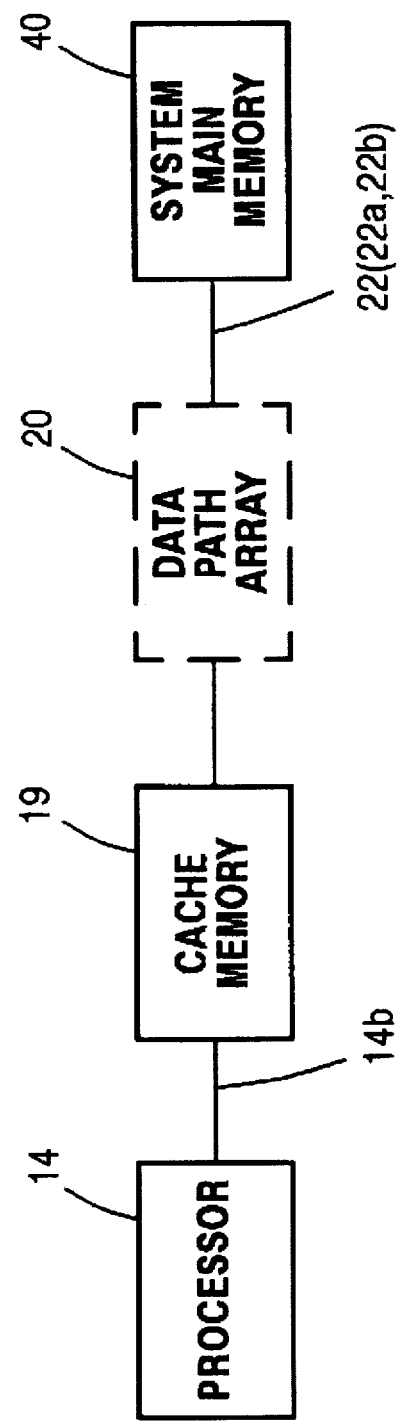
FIG. 4 is a block diagram showing a brief view of a general computer system and its elements of the prior art.

FIG. 3 is an expanded view of the mask logic block unit 33. Here, there is shown the mask matrix unit 34 being fed from the random set counter 31 and by the enable switch lines from the maintenance subsystem 60. The mask matrix unit 34 provides one output on line 35 designated DONT_LOAD and provides two outputs designated on lines 36 for a RX count number, RXCNT(1,0). These outputs are fed to the Hold flip-flops 38, which then provide an output on line 39 to provide the random count number, RX(1,0).

In FIG. 3, the R sequence R(1,0) on line 32 (from the random set counter 31 is shown in FIG. 3 to operate through a sequence of 00-01-10-11-00. Likewise, the output on line 39 which is the random count RX(1,0) will provide a random set of the R(1,0) sequences.

The random count outputs designated RX in Table I shown later below will continuously go through the states of 00-01-10-11-00 in a manner that is somewhat random-like as far as the cache logic is concerned. The reason that there is an appearance of "randomness" to the cache, is the "asynchronous" clocking. The masking logic 33, FIG. 3, will capture some particular count state into the hold flip-flops 38 (described below). Since the incoming counts are captured at a different rate, the captured count numbers will be "random-like". For these counts, the values 00 corresponds to selecting the cache set 0, the value 01 corresponds to selecting the cache set 1, the value 10 selects the cache set 2 and the value 11 selects the cache set 3.

Providing an input in FIG. 3 to the mask logic block unit 33, are also the four enable switch lines 37 ($37_{a0}$, $37_{b1}$, $37_{c2}$, $37_{d3}$) from the maintenance subsystem 60. These have signals in FIG. 3 designated as E3, E2, E1, and E0. These signals are static-like signals, that is to say, they do not normally change after the initialized state except upon cache error detection. These signals are active low, therefore if E0 is low, then the cache set 0 is enabled. Further, if E2 is high, the cache set 2 is "disabled" and put off-line. Similarly, if E3 is low, the cache set 3 is enabled, if E3 is high, the cache set 3 is disabled.

The mask block unit 33 puts out the revised version of count signals, that is to say, they are designated as the "masked" count on line 39 of FIG. 3. These output signals, line 39, are called RX1, and RX0, and are described in further detail hereinunder in Table I.

FUNCTIONAL OPERATION—MASKING LOGIC BLOCK UNIT 33

As seen in FIG. 3, the masking logic block unit 33 has certain functional reasons for initiating the masking operation. This is done to get the optimum and most efficient performance from a cache system having multiple set cache units, and one must seek to keep the cache system full of current data that the processor is most likely to need. Thus, a multiple-set (multiple-way) cache organization has been found to provide a very efficient way of doing this.

To be effective, however, a multiple-set system must seek to fill all of the cache sets as "equally" as is possible. Thus, if only set 0 were filled most of the time and the other sets only contained old, infrequently used data, then the cache module 19 would essentially be one-fourth its real size, since only one-fourth, that is to say, set 0, would normally be used by the processor 10. Therefore, cache filling algorithms must be used so as to seek to fill all of the four sets approximately equally over a generalized time period. In this way, the full cache capacity, that is to say, all of the data RAM structure will be efficiently utilized.

In a multi-set cache, the "random fill method" provides sufficient equality of selection of the various cache sets during the fill operation. However, if in a multi-set cache memory, any set can be taken off-line, it is then necessary to adjust the filling algorithm accordingly. If the proper adjustment is not made, then if a given set is off-line, (say, for example, set 1 is off-line), and if at fill time, the random count points to this off-line set (the count points to set 1 in the example), then no actual fill operation takes place as far as the entire cache is concerned. The fill logic will attempt to write the data from main memory into the cache set that has been selected (set 1), but this is "off-line" and thus no real write-in action will take place.

Therefore, later on, when the processor 14 attempts to read from this addressed area (set 1), the cache will give a "miss" condition because the set 1 into which the fill operation occurred, has been "off-line". Thus, while this processor read operation "should have been" a cache hit, in this case, it is a "miss" due to the off-line condition of set 1 ($19_{d1}$ of FIG. 1). This type of non-adjustment is very inefficient for processor performance.

Therefore, in a multiple-set cache organization, where it is possible for any set or combination of sets to be both "on-line" or "off-line", it is necessary to adjust the random fill count accordingly for most efficient utilization. The mask logic block unit 33 shown in FIG. 3, provides the proper adjustment for all possible combination of sets whether they are on-line or off-line. It does this to assure the highest possible efficiency of processor performance even in a degraded cache condition where one or more sets are off-line. Thus, even in degraded operations, with combinations of sets being off-line, the remaining "on-line" sets will be equally and properly filled.

OVERVIEW OF MASKING LOGIC BLOCK UNIT 33

The masking logic block unit 33 is seen to hold two operating units in FIG. 3. These units are the masking matrix unit 34, and the new count-holding flip-flops 38. The holding flip-flops 38 involve two flip-flops for a four-set cache and are clocked at the cache-processor clock frequency rate. This clock rate is "asynchronous" to the clock rate at which the incoming random counter bits are counting from the random set counter 31. This asynchronousness helps provide a random-like count to the cache fill logic.

At each cache-processor clock time (except as noted below), the holding flip-flops 38 will take on a new set count value. The set count values can range from having the values of 00, 01, 10, 11, corresponding to selecting the cache sets 0 through 3, respectively. The new set count values to be held in the flip flops 38, are derived from the mask matrix unit 34, but will include only the on-line sets, and will not include the off-line sets.

The masking matrix unit 34 monitors the four maintenance enable switch lines 37 of FIG. 3. The switch state indicates the level of cache operation at any given time. Thus, if all the switches are "on" then the cache is operating at full strength and all four sets of the cache module are in useful operation. If some other combination of switching levels are present, then the cache module is operating on some degraded level. It may be noted generally, that all 16 possible states of the four enable switch lines 37 must be considered in the equation.

The masking matrix unit 34 also receives the incoming count values from the random set counter 31. From this particular value received and with consideration of the switching state provided by the switch lines 37, the mask matrix unit 34 then generates a new set count value. This new "set count value" will assure the highest possible cache efficiency at the current cache operational level. That is to say, it will maximize the usage of all of the current "on-line" cache sets.

The masking matrix unit 34 will be seen to produce 3 signals. Two of these are the "count bits", RXCNT (1, 0) which are copied into the two holding flip-flops 38 (RX1, RX0). The third signal on line 35 is called the "DONT LOAD" and this prevents the loading of the holding flip-flops 38 for certain particular conditions which will be described hereinafter.

MASKING BLOCK-MASKING MATRIX ALGORITHM

For full list efficiency of the cache operations, that is to say, to achieve the highest possible hit rate for the processor, it is necessary to fill all of the cache sets equally. This is handled by means of a masking matrix algorithm. To fill all cache sets equally, this means that each of the sets gets filled as often as does any other one of the cache sets. The masking matrix algorithm is a random algorithm which implies that at any given moment, when a cache miss has occurred (that is to say, a fill operation has to be done) that the cache set-selection count has "equal probability" of being any one of the four possible set count values (00, 01, 10, 11).

Since the random counter 31 of FIGS. 2, 3 is most simply made by having it remain ignorant of the state of the enable switches on switch lines 37 (FIG. 3), the least expensive hardware adjustment is to pass the random count values through a simple, inexpensive masking mechanism. This is accomplished in the mask logic 33 of FIGS. 2, 3. The mask logic 33 provides a matrix organization which must still meet the high efficiency goal of filling all of the "on-line" cache sets equally while omitting the off-line cache sets. Thus, for example, if only three of the four possible sets are "on-line," then the algorithm must fill each one of the three active sets equally. The mask matrix adjusts the random count values in order to provide this possibility.

The maintenance enable switches are in the maintenance subsystem 60 are expressed through the enable switch lines 37 of FIGS. 2, 3. There is one enable switch line for each cache set and in the present example this would come to four lines $37_{a0}$, $37_{b1}$, $37_{c2}$, $37_{d3}$ to cover the four cache sets. The maintenance enable switches can theoretically be in any one of 16 possible states. For example, if there were a state of switches set as 0, 0, 0, 0, this would mean in FIG. 1 that all four cache sets are "on-line." However, if there were a switching state equal to 1,0,0,0, this would mean that the first data set $19_{d0}$ is off-line and the other three sets $19_{d1}$, $19_{d2}$, and $19_{d3}$ are remaining on-line. The mask matrix algorithm in the mask logic 33 of FIGS. 2, 3 must account for all possible switch state combinations and yet still provide an equal set filling function of all the remaining on-line sets of the cache module 19.

The mask matrix 34 provides three signals within the mask logic 33 of FIG. 3. Two of the signals, designated R1 and R0, are adjusted count bits to be loaded into the holding flip-flops 38. The third signal on line 35, designated DONT_LOAD inhibits the loading of the holding flip-flops 38 for certain count values. The "DONT LOAD" acts to inhibit loading of counts for sets that are "OFF-LINE" as per Table II hereinunder.

The combination of these three items insures that all of the remaining on-line sets will get equal filling opportunities and thus provide the highest possible cache efficiency.

The Table I shown below gives for each possible combinational state of the enable switch lines 37 the adjusted RX count for each of the incoming random count values, $R_n$.

TABLE I

| Enable Switch State | Mask Output Count for given Input Count (From FIG. 3, line 32 and line 36) | | | |
|---|---|---|---|---|
| E3,E2,E1,E0 | R=11 RXCNT | R=10 RXCNT | R=01 RXCNT | R=00 RXCNT |
| 0000 | 11 | 10 | 01 | 00 |
| 0001 | 11 | 10 | 01 | — |
| 0010 | 11 | 10 | — | 00 |
| 0011 | 11 | 10 | — | — |
| 0100 | 11 | — | 01 | 00 |
| 0101 | 11 | — | 01 | — |
| 0110 | 11 | — | — | 00 |
| 0111 | 11 | — | — | — |
| 1000 | — | 10 | 01 | 00 |
| 1001 | — | 10 | 01 | — |
| 1010 | — | 10 | — | 00 |
| 1011 | — | 10 | — | — |
| 1100 | — | — | 01 | 00 |
| 1101 | — | — | 01 | — |
| 1110 | — | — | — | 00 |
| 1111 | — | — | — | — |
| | 11 selects Set 3 | 10 Selects Set 2 | 01 Selects Set 1 | 00 Selects Set 0 |

DONT_LOAD SIGNAL

As seen in FIG. 3, the DONT_LOAD signal is shown at line 35. The holding flip-flops 38 normally can load a new adjusted random count value on each cache-processor clock pulse. However, in the degraded states, in order to get full cache filling of the remaining on-line sets, the loading of the holding flip-flops 38 is inhibited under certain conditions. Table II shown below gives the cases where the DONT_LOAD signal is active. It may be noted that these cases are derived both from the switching states on lines 37 and the incoming random count values on line 32 of FIG. 3.

TABLE II

DONT_LOAD active (=1) [Line 35, FIG. 3]

| Enable Switch State E3,E2,E1,E0 on Line 37, FIG. 3 | incoming count R= on Line 32, FIG. 3 |
|---|---|
| 0001 | 00 |
| 0010 | 01 |
| 0011 | 01 |
| 0011 | 00 |
| 0100 | 10 |
| 0101 | 10 |
| 0101 | 00 |
| 0110 | 10 |

TABLE II-continued

DONT_LOAD active (=1) [Line 35, FIG. 3]

| Enable Switch State E3,E2,E1,E0 on Line 37, FIG. 3 | incoming count R= on Line 32, FIG. 3 |
|---|---|
| 0110 | 01 |
| 1000 | 11 |
| 1001 | 11 |
| 1001 | 00 |
| 1010 | 11 |
| 1010 | 01 |
| 1100 | 11 |
| 1100 | 10 |

When "DONT LOAD" = 1, then RX flip-flops will hold their previous states

ADJUSTED COUNT VALUE SIGNALS

The holding flip-flops 38 of FIG. 3 are loaded to the value of the adjusted count signals. These count signals are called RX1 and RX0. The value RX1 is the most significant bit. The RX count signals on line 36 (FIG. 3) from the mask matrix 34 are loaded into the holding flip-flops 38 as illustrated in the Table III shown below. The plus sign in Table III indicates the "OR" function. The designation "E=XXXX" indicates the switching state shown in Tables I and II which refers to FIG. 3 which illustrates the "enable switch lines", E(3,2,1,0), these lines being shown as four lines 37a0, 37b1, 37c2, 37d3.

TABLE III

| RX1 = (most significant bit) | RXCNT1 +(E=0111) +(E=1011) | (masked random count bit 1) (switch state) (switch state) |
|---|---|---|
| RX0 = (least significant bit) | RCNT0 −(E=0111) −(E=1101) | (masked random count bit 0) (switch state) (switch state) |

The masking block logic unit 33 of FIG. 3 is made up of the masking matrix logic 34 and the holding flip-flops 38. This masking block 33 is implemented in a unusually simply and expensive fashion. It is a very small portion of a field programmable PAL (programmable array logic) which is called "Flex-Pal." These units are manufactured by the Intel Corporation of San Jose, Calif. and the Altera Corporation of San Jose, Calif.

The entire implementation will consume only three "macrocells" of the possible 80 cells in the Flex-Pal. One of the macrocells which builds the DONT_LOAD signal, uses an "internal" only cell which means that it does not use up any of the Flex device's valuable input/output pins. The other two macrocells which build the two new count flip-flops RX1 and RX0, use external cells and make use of only two of the 132 pins on the Flex-Pal device.

The Mask Logic 33 combines the input from the Random set counter 31 with the inputs from the Enable switches in Maintenance Subsystem to select only those cache sets "on-line" and to insure that an equitable distribution of "Write data" (fills) is apportioned to each cache set.

The equality of distribution is assured in three ways:

1. The random counter 31 provides a balance (equal count) of all four counts (00, 01, 10, 11, 00, 01, 10, 11, etc.). If it were used directly, it is obvious that the distribution would be equal.

2. However, the Mask Matrix modifies the random count. As noted from Table I, all four combinations of the RXCNT (00, 01, 10, 11) are present in equal numbers of times (amounting to eight). This assumes that no matter what the switch state (line 37) appears to be, an equal distribution will occur.

3. As seen in Table II, again all of the counts for "R" on line 32 (00, 01, 10, 11) are present an equal number of times (four times). Again, this also assures equal distribution to the "on-line" sets.

The herein described system provides the capability for a multiple-set structured cache design to operate efficiently in fully and completely filling all possible multiple levels of the sets of cache units and thus provide an optimum efficiency. Thus for all the various degraded configurations possible and for the full configuration of the multiple set cache module, the cache module will always operate to its fullest efficiency. The implementation of the present design is simple and very inexpensive since it is implemented virtually free of the three units of logic required and can be fit into any of the existing hardware.

What is claimed is:

1. In a network for selecting which one of N cache sets of a cache module will be filled during a write-fill operation, a system for equitably filling those on-line cache sets in full operation or degraded operation comprising:

(a) a multiple group of N cache sets forming a cache module to a central processor;
   (b) mask logic means for developing a resultant signal for selecting only those cache sets reining on-line for a data fill operation and including:
      (b1) means to equitably distribute said fill data among those cache sets remaining on-line.

2. In a computer network where a central processor is serviced by a cache module having N cache sets, a method for insuring equitable distribution of fill data from main memory to said cache module comprising the steps of:

(a) generating a random count signal which sequences from "0" to "N";
   (b) generating maintenance signals which indicate which particular cache sets of said N cache sets are on-line;
   (c) enabling only those cache sets which are on-line;
   (d) distributing fill data only to those cache sets on-line and in a random selection that equitably places fill data into each cache set remaining on-line.

3. In a computer network wherein a central processor is serviced by a multi set cache memory of N cache sets, a system for insuring an equitable apportionment of fill data to each cache set that remains on-line, said system comprising:

(a) said cache memory including N cache sets where each set has a tag address store and a data word store;
   (b) a cache control unit for enabling or disabling each one of said N cache sets;
   (c) mask logic means for randomly selecting, for a fill operation, only those particular cache sets which are on-line at the time of a fill operation that is being executed, including
      (c1) means to generate, to said cache control unit, a signal which selects which one of said N cache sets will be filled.

4. The system of claim 3 which includes:

(a) a random counter means which sequentially generates number values signal representing each one of said N cache sets;
   (b) maintenance subsystem means having switch means for generating an off-line signal for placing any one or more of said N cache sets into an off-line condition;
   (c) and wherein said mask logic means receives said sequentially generated number value signal to provide a resultant signal to said cache control unit;
   (d) wherein said cache control unit will equitably distribute fill data only to those cache sets remaining on-line.

* * * * *